United States Patent [19]

Crafts

[11] 4,394,706
[45] Jul. 19, 1983

[54] POWER CONVERTER FOR RECREATIONAL VEHICLES

[75] Inventor: Daniel J. Crafts, Battle Creek, Mich.

[73] Assignee: Progressive Dynamics, Inc., Marshall, Mich.

[21] Appl. No.: 56,605

[22] Filed: Jul. 11, 1979

[51] Int. Cl.³ .............................................. H05K 5/02
[52] U.S. Cl. ................................. 361/331; 307/10 R; 307/151; 363/144; 361/334; 361/357; 361/415
[58] Field of Search ................ 363/144; 307/9, 10 R, 307/150, 151; 174/52 R, 52 S, 59; 361/331, 334, 356, 357, 380, 381, 386, 388, 389, 392, 395, 399, 415

[56] References Cited

U.S. PATENT DOCUMENTS

| | | | |
|---|---|---|---|
| 3,456,119 | 7/1969 | Schneider | 307/10 R |
| 3,717,805 | 2/1973 | Gnaldinger | 307/151 |
| 3,721,865 | 3/1973 | Rademaker | 174/52 R |
| 3,758,829 | 9/1973 | Kroll | 361/415 |
| 3,857,044 | 12/1974 | Papoi | 307/9 |
| 4,198,220 | 6/1979 | Yammamoto | 361/415 |

*Primary Examiner*—Gerald P. Tolin
*Attorney, Agent, or Firm*—Price, Heneveld, Huizenga & Cooper

[57] ABSTRACT

A power converter for recreational vehicles comprises a two-part housing construction having the ends of the electrical components of the converter telescopically received in aligned sockets formed in each of the mating housing members, whereby the electrical components are captured therebetween and securely mounted in the housing without separate or special fasteners.

24 Claims, 11 Drawing Figures

POWER CONVERTER FOR RECREATIONAL VEHICLES

BACKGROUND OF THE INVENTION

The present invention relates to power converters for recreational vehicles and the like, and in particular to a concept for mounting the electrical components of the converter in a housing.

Recreational vehicles, such as motor homes, vans, campers, trailers and the like, are typically equipped with an electrical system for operating lights and other appliances, which is compatible with and operates off of the standard electrical power system of the vehicle. Generally, such vehicles have a 12 volt DC electrical system, and include at least one storage battery, and an alternator and/or generator which charges the battery and is driven by the vehicle engine. When the vehicle engine is in operation, such as when the vehicle is being driven on the highway, or is idling, the electrical appliances of the recreational vehicle are powered by the vehicle's 12 volt battery system. When the vehicle engine is not operating, such as when the vehicle is in a parked or stored condition, the continued use of the vehicle's electrical appliances will drain the battery's electrical charge, and eventually completely discharge the battery. Although the storage battery can often be recharged, the amount of discharge is often sufficient to prevent the starting of the vehicle engine, thereby severely inconveniencing the user. Further, repeatedly discharging the battery to a very low level can permanently damage the storage battery and greatly reduce its operating life. Although the vehicle engine can be started periodically to recharge the battery, such a procedure is quite inconvenient, inefficient, and often hazardous due to the engine's emission of toxic gases, particularly carbon monoxide. To alleviate these problems, recreational vehicles are sometimes equipped with a separate electrical generator. However, such generators are quite expensive, increase the total weight of the vehicle, and do not completely eliminate the hazard of exposure to toxic exhaust gases.

Recreational vehicles have also been provided with transformers or converters to power the vehicle's electrical system by a conventional 110 VAC source of household current when the vehicle engine is not operating and the vehicle is located near a suitable electrical source. These devices convert the household 110 VAC source to a 12 volt DC current which is compatible with the vehicle'electrical system and the associated appliances. In this manner, when the recreational vehicle is immobile, such as when the same is parked at a camp site having electrical outlets available, the 110 VAC source can be connected with the transformer and the electrical appliances in the vehicle can be operated without draining the vehicle's storage battery or requiring the vehicle engine to be started.

Such converters typically include the basic elements of a transformer, a rectifier, and a fuse or circuit breaker, all of which are encased in a housing which is mounted inside the recreational vehicle. The housing generally comprises a two-part construction with a concave base and a relatively flat cover plate to which the various electrical components are mounted. The installation of such units is achieved by providing an aperture in a selected wall of the vehicle, mounting the concave base therein, threading the vehicle's electrical service wires through the concave base and connecting the same with the converter components which are mounted on the housing cover plate, and inserting the cover plate with components thereon into the concave base, and interconnecting the two housing members. Because the cover plate supports a rather heavy transformer, as well as the other electrical components, the same requires a very rigid construction which is typically fabricated from a metal plate. However, the use of such conductive materials presents an electrical safety hazard. Further, the attachment of the components to the cover plate requires a plurality of stout metal fasteners, which typically extend through the front cover plate and are connected with the various electrical components of the converter. This type of interconnection requires a substantial amount of assembly time and cost to insure a secure mounting of the converter components onto the front panel, and also defaces the housing and imparts a rather unsightly appearance thereto. This type of interconnection also requires the use of specially designed electrical components, which are provided with custom mountings to mate with the fasteners, and fasteners sufficiently strong to suspend the components on the housing cover. Heretofore, metal fasteners have been used to achieve the required mounting strength, thereby exacerbating the hazard of electrical shock. As a result of the above noted two-part housing construction, heretofore the power converters have been very difficult to repair, are susceptible to damage during installation, and may be tampered with either before or after installation in the vehicle, thereby increasing the manufacturer's exposure to potential liability.

Although in some power converters the electrical components are fastened to the base portion of the housing, the relatively deep sidewalls of the housing which are required to encase the components renders the assembly process quite difficult, time consuming and costly.

SUMMARY OF THE INVENTION

The present invention provides a concept for mounting the electrical components of a power converter between mating housing portions and securely retaining the same in the housing without separate or special fasteners. A pair of aligned sockets are formed in the housing portions and are shaped to telescopically receive one end of an associated electrical component therein.

The principal objects of the present invention are: to provide a power converter for recreational vehicles having a housing adapted to securely mount the electrical components of the converter therein without separate or special fasteners; to provide such a power converter wherein the housing is shaped to mount readily available, standard electrical components therein for reduced manufacturing costs and improved performance; to provide such a power converter having a unitary, tamper-proof construction for ease of installation; to provide such a power converter, wherein the housing is provided with an access aperture and cover therefore for connecting vehicle service wires therewith without disturbing the interconnection and/or mounting of the electrical components of the converter; to provide such a housing having a partition dividing the housing into two separate compartments for mounting a transformer in one compartment and a circuit breaker in the other compartment to isolate the same; to provide such a housing wherein the partition is telescopically received in a pair of aligned channels disposed in the housing portions, whereby the partition is captured therebetween to mount the same in the housing without separate fasteners; to provide such a power converter having the housing constructed of a non-metallic material for alleviating the hazard of electrical shock; and to provide such a power converter which is economical to manufacture, efficient in use, capable of a long operating life, and particularly well adapted for the proposed use.

These and many other important advantages of the present invention will be further understood and appreciated by those skilled in the art by reference to the following written description, claims and appended drawings.

DESCRIPTION OF THE PREFERRED EMBODIMENTS

Figure 1:
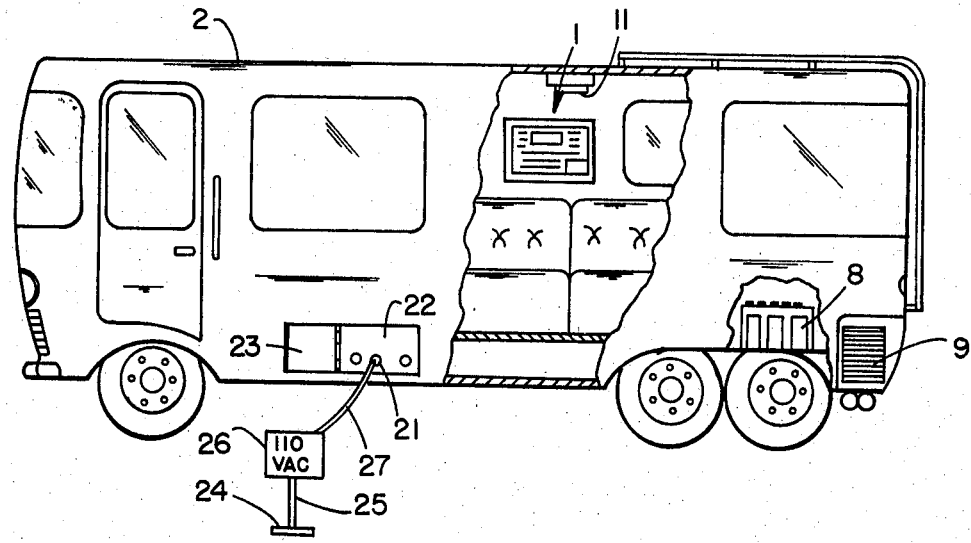
FIG. 1 is a partially schematic side elevational view of a recreational vehicle and a power converter therefor embodying the present invention, with a portion of the vehicle broken away to reveal internal construction.
Figure 2:
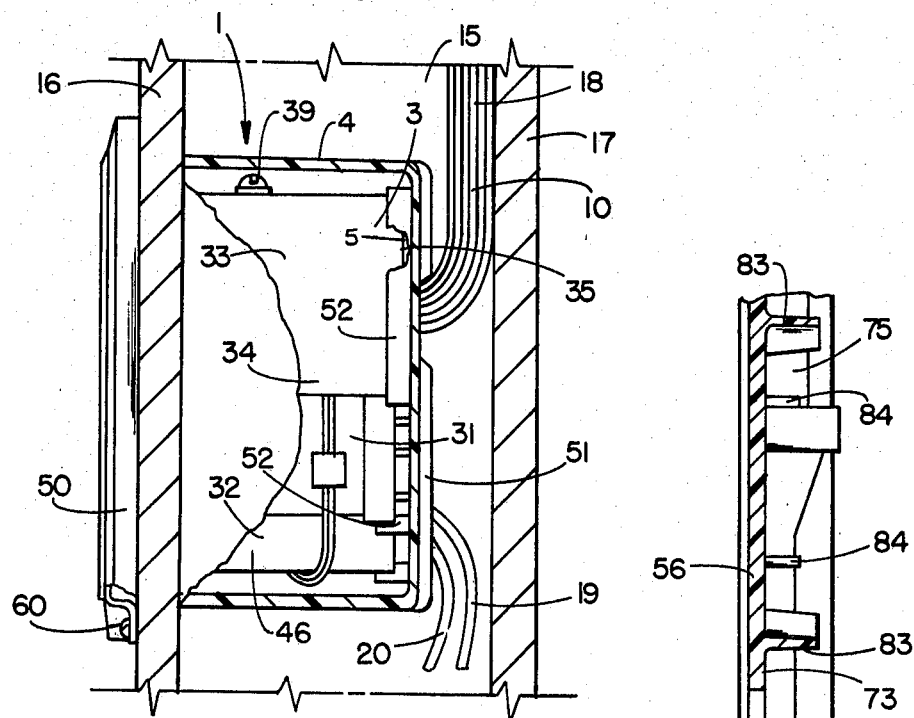
FIG. 2 is a partially schematic vertical cross-sectional view of a wall portion of the vehicle having the power converter mounted therein with portions thereof broken away.

For purposes of description herein, the terms "upper", "lower", "right", "left", "rear", "front", "vertical", "horizontal", and derivatives thereof shall relate to the invention as oriented in FIGS. 1 and 2. However, it is to be understood that the invention may assume various alternative orientations, except where expressly specified to the contrary.

With reference to FIGS. 1 and 2, the reference numeral 1 generally designates a power converter embodying the present invention, which is adapted for connection with a recreational vehicle 2. The power converter 1 includes a plurality of electrical components 3 which are mounted in a housing 4 having a two-part construction. The ends of each of the electrical components 3 are telescopically received in aligned sockets 5 formed in each of the mating housing members, whereby the components are captured therebetween and securely mounted in the housing without separate or special fasteners.

The power converter 1 is particularly adapted for use in conjunction with a recreational vehicle 2, such as a trailer, camper, or the like, and in the illustrated example comprises a motor home. The motor home 2 includes a 12 volt DC storage battery 8 which is charged by the alternator of the vehicle, which is in turn driven by the vehicle engine 9. The storage battery 8 is electrically connected with the ignition portion of the engine, and is also connected through a wiring system 10 with selected electrical appliances in the recreational vehicle, such as the illustrated overhead lamp 11. When the vehicle engine is in operation, the lamp 11 is powered by the vehicle's 12 volt battery through the associated electrical wiring system 10 when the switch is in battery position.

The power converter 1 is mounted in a sidewall 15 of the recreational vehicle 2, normally in a goucho front surface below the seat. The illustrated sidewall 15 includes an interior wall 16 and an exterior wall 17 which are spaced apart a distance which is slightly greater than the depth of the power converter housing 4. The wiring system 10 includes a plurality of individual wires 18 which connect each of the electrical appliances of the recreational vehicle with the power converter 1. The power converter 1 also includes a first conductor 19 which connects the same with the vehicle storage battery 9, and a second conductor 20 which connects the power converter with a conventional 110 VAC source of household current. In this example, the conductor 20 is connected with an outside receptacle or socket 21 which is mounted in a recessed area 22 on the exterior surface of the recreational vehicle, and includes a hinged closure 23 therefore. The recreational vehicle 2 is disposed adjacent to a source of 110 VAC electrical power 24, which is illustrated as a pedestal arrangement 25 with a weatherproof housing 26 mounted thereon, and an electrical conductor 27 interconnecting the source 24 with the receptacle 21. In this arrangement, the power converter 1 is capable of converting the 110 VAC power source to 12 VDC power, and distributing the same to the vehicle's electrical appliances through the wiring system 10. It is to be understood, however, that the present invention contemplates the use of alternative electrical components, capable of converting virtually any type of household current to a form compatible with the electrical system of any given recreational vehicle.

The basic electrical components 3 of the illustrated power converter 1 are schematically illustrated in FIG. 2, and include a transformer 31, a rectifier 32 and a circuit breaker 33, each of which is electrically interconnected, and mounted in the housing 4. The transformer 31 is a rather heavy component, and is adapted to alter the voltage of the source 24 from 110 volts to 12 volts. The rectifier 32 alters the power source characteristics from alternating current to direct current, which in conjunction with the transformer 31, provides the 12 volt DC current which is compatible with the vehicle's wiring system 10 and electrical appliances 11. The circuit breaker 33 is connected with the 110 VAC source 24 through the conductor 20, and is adapted to open the circuit between the 110 VAC source and 110 V loads upon exceeding a predetermined electrical current, such as 15 amps. Although a circuit breaker is shown in the illustrated embodiment, it is to be understood that the present invention contemplates the use of any suitable electrical fuse arrangement.

The circuit breaker 33 is preferably a conventional, household 110 VAC type of circuit breaker, which is readily obtainable through a plurality of retail outlets, and has a standardized exterior shape, designed to be installed with other circuit breakers in a standard junction box for buildings. The body portion 34 of the illustrated circuit breaker 33 has a substantially rectangular shape with opposed end portions 35 thereof extending between the mating housing portions. The forward end of the circuit breaker includes an outwardly projecting, rectangularly shaped portion 36 (FIG. 10), which forms a ledge or shoulder 37. The circuit breaker includes a switch lever 38 which extends through an associated aperture in the front portion of the housing 4, and an input terminal 39 (FIG. 1) connected with an upper sidewall of the circuit breaker body 34.

Figure 10:
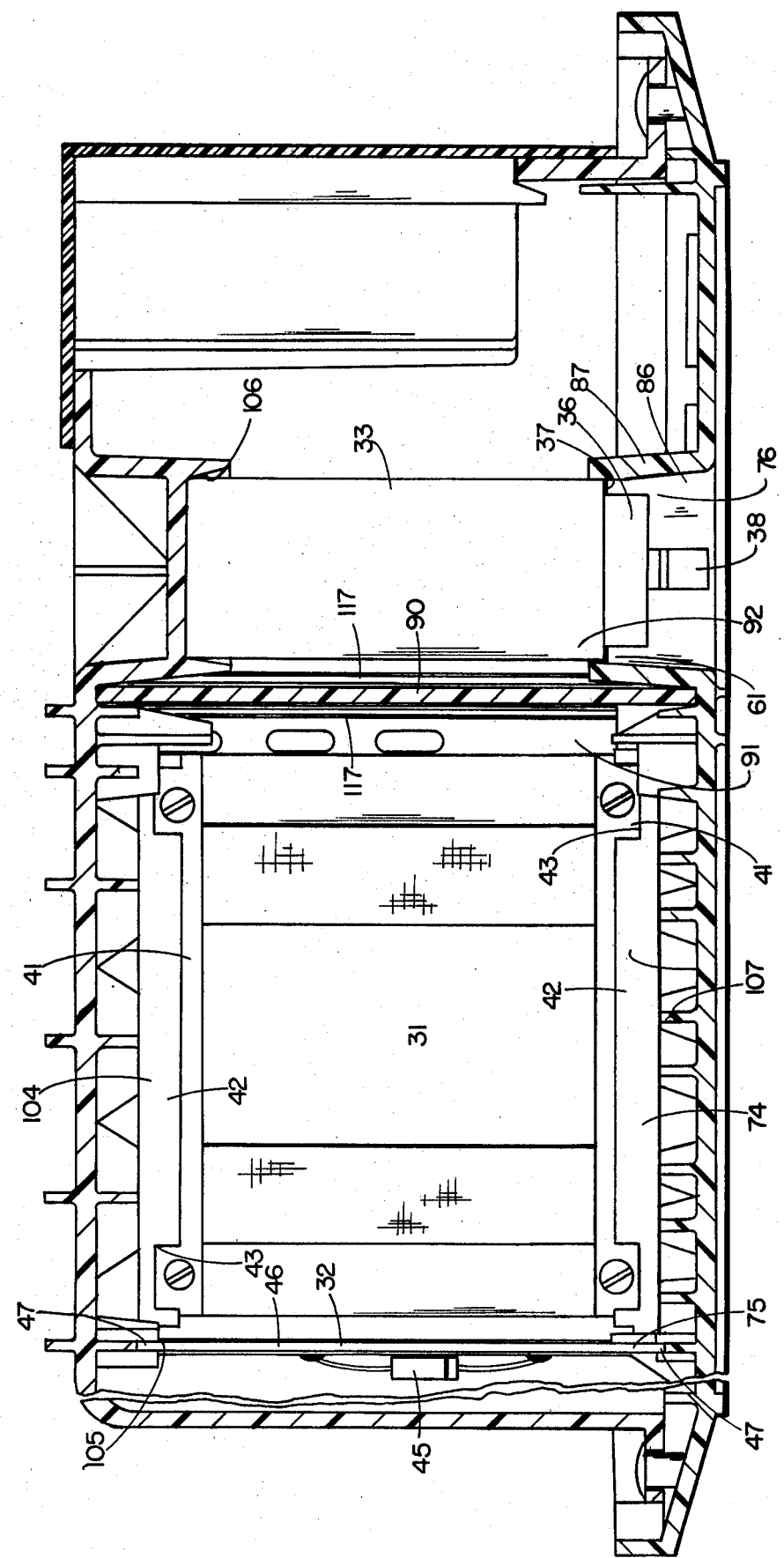
FIG. 10 is a cross-sectional view of the housing taken along a medial portion thereof, showing electrical components mounted therebetween.

The transformer 31 is also preferably of a conventional or standard construction, and as best illustrated in FIG. 10 includes opposing end portions 41 which extend between the mating members of the housing 4. In this example, an adapter 42 is connected with each of the transformer end portions 41 and includes a marginal interior surface having a shape substantially indentical with the associated transformer end, and is telescopically received thereinto. The exterior surface of the adapters 42 preferably has a regular shape which is designed to extend telescopically within a mating portion of the power converter housing 4 to mount the same in a manner which shall be described in greater detail hereinafter. The illustrated adapters 42 are in the shape of a rectangular frame having an L-shaped transverse cross section, and includes notches 43 to mate with fasteners in the transformer.

The illustrated rectifier 32 (FIG. 10) comprises a plurality of diodes 45 which are mounted on an insulator board 46 with end portions 47 thereof extending between the mating portions of the housing 4.

The housing 4 is adapted for mounting in the recreational vehicle 2, and includes two mating portions, comprising a panel 50 (FIG. 2) and a cover 51, each of which includes an interior surface with a socket 5 positioned thereon for each of the electrical components 3. Each of the sockets 5 is shaped to telescopically receive one end of an associated one of the electrical components 3 therein. The sockets 5 are arranged in pairs, with one member of each pair disposed in the panel 50 and cover 51, respectively, and the members of each socket pair is aligned for receiving the associated electrical component therebetween. Each of the sockets 5 has a central axis which extends substantially perpendicularly of the associated housing member from the geometric center thereof, and each of the socket axes are disposed in a mutually parallel relationship. The housing panel and cover 50 and 51, respectively, are interconnected by aligning the socket pairs; and converging the same along an axis parallel with the socket axes, with opposing ends of the electrical components positioned between and aligned with the associated socket pair, whereby each of the electrical components is captured therebetween to securely mount the electrical components in the housing without separate fasteners.

Figure 3:
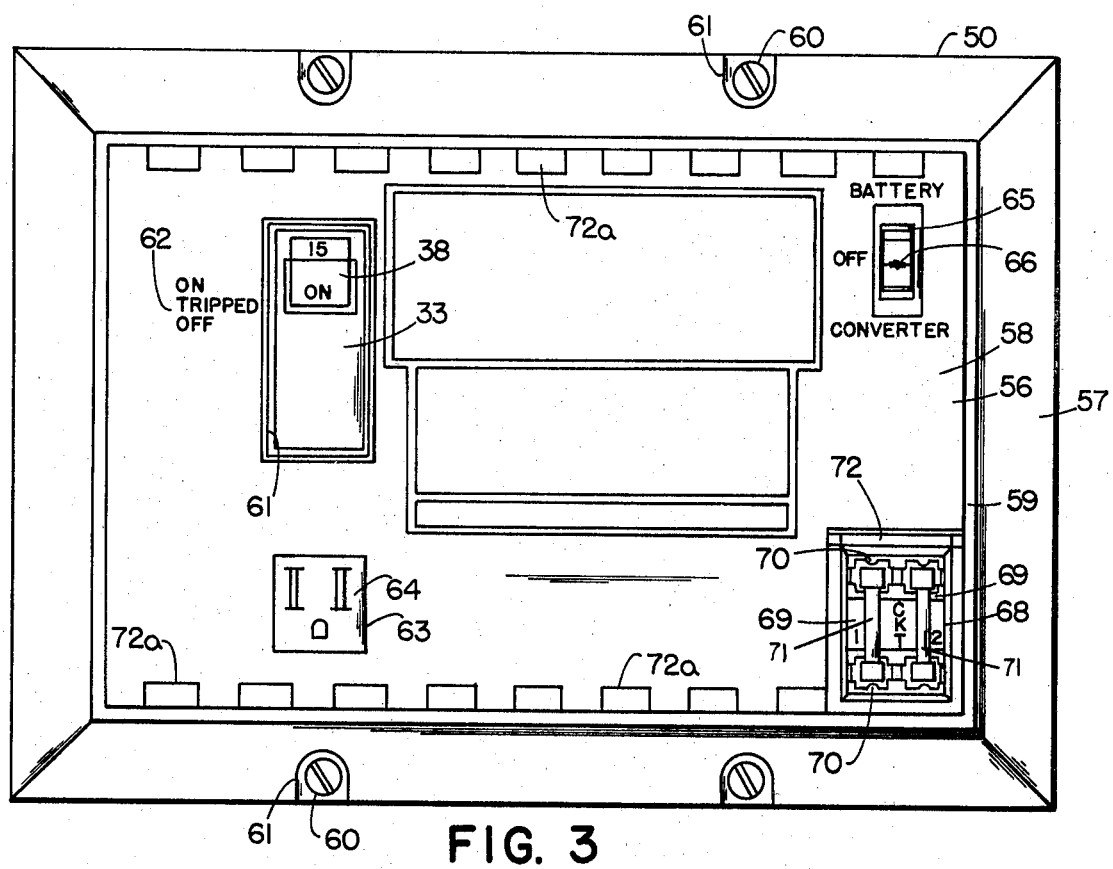
FIG. 3 is a front elevational view of a housing cover portion of the power converter.
Figure 4:
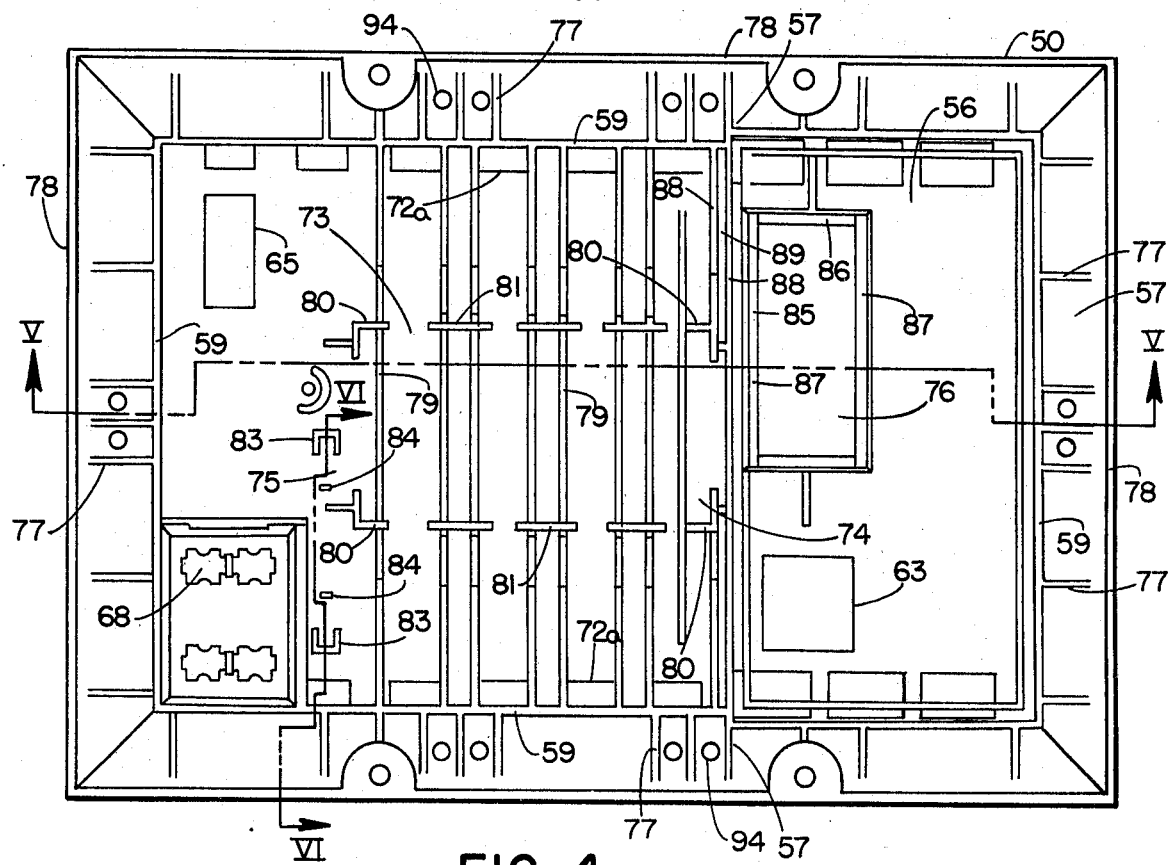
FIG. 4 is a rear elevational view of the housing cover, showing an interior surface thereof.

With reference to FIGS. 3 and 4, the illustrated housing 4 has a substantially rectangular overall shape, and the panel 50 includes a central panel 56, having an inclined flange member 57 extending around the perimeter thereof. The outside surface 58 of the housing panel 50 is substantially planar, and extends to a marginal ridge 59 upstanding slightly therefrom, which merges into the flange 57 being inclined inwardly toward the interior wall 16 of the recreational vehicle. The illustrated power converter 1 is attached to the vehicle wall 16 by four, spaced apart threaded fasteners 60, and recesses 61 are provided in the flange 57 to receive the heads of the fasteners 60 therein. The housing panel 50 includes a rectangularly-shaped aperture in an upper, left hand portion of the panel which exposes a forward end portion of the circuit breaker 33, and permits the switch lever 38 thereof to extend therethrough for convenient access by the user. Indicia 62 may be provided adjacent to the aperture 61 to indicate the position of the circuit breaker 33. A second aperture 63 is provided in the lower left-hand portion of the panel 50, and is shaped to allow an electrical outlet fixture 64 to extend therethrough. The illustrated outlet 64 is connected through circuit breaker 33 with the 110 VAC power source 24, and provides a convenient source of 110 VAC power to the interior of the recreational vehicle, from which standard household appliances, such as televisions, radios, and the like may be powered. A third aperture 65 is provided in the upper right-hand corner of the housing panel 50, and is shaped to permit a switch 66 to extend therethrough. The illustrated switch 66 is a three-position electrical switch, which in one position directs the converter output to the vehicle wiring system, and in the opposite position, directs 12 VAC power from the vehicle storage battery 9 through fuses 71 to the vehicle wiring system 10. A centrally disposed off position is provided, so that the user can interrupt all power to the electrical system of the vehicle, such as for storage, or the like. Indicia 67 is provided adjacent the switch 66 to indicate its position. A 12 volt DC fuse retainer mechanism 68 is provided in the lower right-hand corner of the panel 56, and includes a pair of recesses 69 disposed in a side-by-side relationship, with a contact 70 positioned at each end thereof to mate with a 12 volt fuse 71. The fuses 71 are electrically connected between the converter switch 66 and the vehicle wiring system 10 to prevent an excessive flow of current through the latter. A slide cover 72 is mounted over the fuses 71 and provides a closure for the recessed portion 69 of the fuse retainer 68. A plurality of cooling apertures 72a extend through the panel 56 of the front cover adjacent the upper and lower portions of the ridge 59 to provide air cooling of the electrical components, and are spaced apart in a regular fashion along the ridge.

Figure 5:
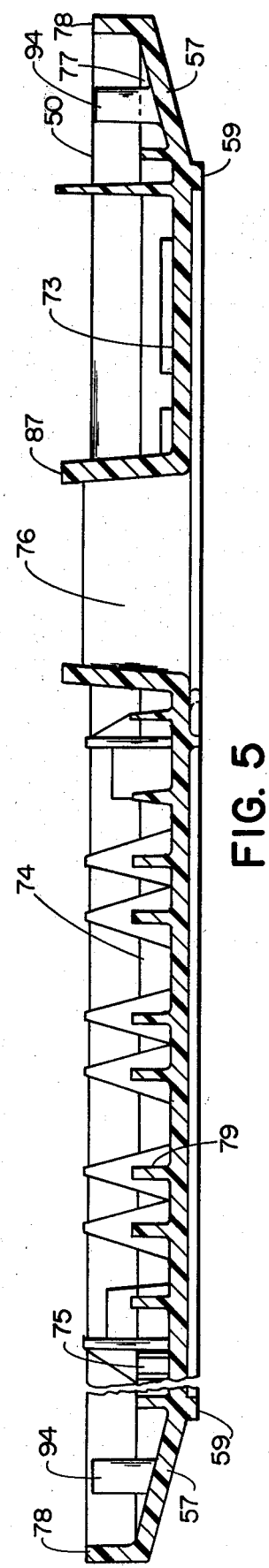
FIG. 5 is a cross-sectional view of the housing cover taken along the line V—V of FIG. 4.

The housing panel 50 includes an interior surface 73 (FIGS. 4 and 5), having three separate sockets 74, 75, 76 shaped to receive therein an associated end of the transformer 31, recifier 32, and circuit breaker 33, respectively. The interior surface of the flange portion 57 includes a plurality of outwardly extending ribs 77 which are disposed perpendicularly between the ridge 59 and the associated marginal edge 78 of the panel. A second set of ribs 79 protrudes from the interior surface 73 of the panel and extends between the upper and lower portions of the ridge 59. The ribs 79 form a surface for engaging the adapter 42 and forward end of the transformer 31 and positioning the same a spaced apart distance from the central panel member 56 for electrical insulation and improved cooling. The transformer socket 74 has a substantially rectangular shape, and is formed by four L-shaped braces 80 extending upwardly of the upper edges of the ribs 79 at each corner of the transformer end. A plurality of tabs or planar retainers 81 are disposed on each side of the transformer and are regularly spaced apart and aligned with the corresponding leg of the corner brace 80, such that the same form a well or depression into which the adapter 42 and the forward end of the transformer is telescopically received.

Figure 6:
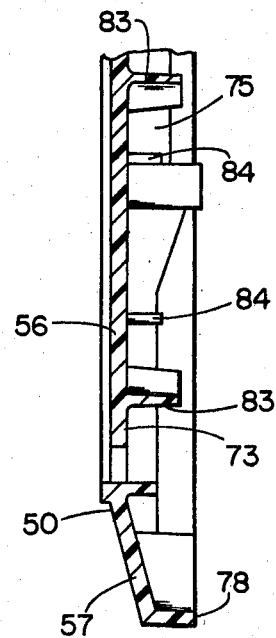
FIG. 6 is a fragmentary cross-sectional view of the housing cover taken along the line VI—VI of FIG. 4.

With reference to FIGS. 4 and 6, the rectifier socket 75 includes a pair of U-shaped channel members 83 which protrude outwardly of the interior surface 73 of the housing cover, and are spaced apart and aligned, with the open ends of the channel members facing each other. The interior surface of each of the U-shaped channels 83 is shaped to receive a corresponding end portion of the rectifier board 46 telescopically therein. A pair of spaced apart posts 84 are aligned with the U-shaped channel members 83, and project outwardly of the cover interior surface 73 to form a pedestal upon which the corresponding end edge of the rectifier board 46 abuts, thereby positively positioning the rectifier a spaced apart distance from the housing cover for improved electrical insulation.

The circuit breaker socket 76 (FIGS. 4 and 5) is formed by side and end walls 85 and 86, respectively, which project outwardly of the cover interior surface 73 about the marginal edge of the circuit breaker aperture 61. The free end edges 87 of the sidewalls 85 are adapted to abuttingly engage a corresponding portion of the circuit breaker 33, and position the same transversely between the panel and cover portions of the housing.

The housing panel 50 also includes a pair of parallel ribs 88 extending outwardly of the interior cover surface 73, and between the upper and lower portions of the ridge 59, thereby forming an elongated U-shaped channel 89 thereinbetween. The ribs 88 are positioned between the transformer socket 74 and circuit breaker socket 76, and terminate at the flange 57 to telescopically receive the forward end edge of a partition 90 (FIG. 10) therebetween. The partition 90 is a rectangularly shaped plate positioned within the housing 4 and extends therein along a plane disposed substantially parallel with the axes of the sockets 5, and divides the housing into two separate compartments 91 and 92. The transformer 31 and rectifier 32 are mounted in compartment 91, and the circuit breaker 33 is mounted in the other compartment 92, thereby isolating the same in compliance with generally accepted wiring requirements. The illustrated portion 90 (FIG. 10) includes three apertures therethrough with wire retainer grommets 95 therein to electrically interconnect the electrical components, and is otherwise imperforate to form a seal between the two compartments 91 and 92. Tapered studs 94 (FIG. 4) project outwardly from the inside surface of the panel flange 57, and are spaced therealong to facilitate connecting the panel 50 to the housing cover 51 in a manner to be described in detail hereinafter.

Figure 7:
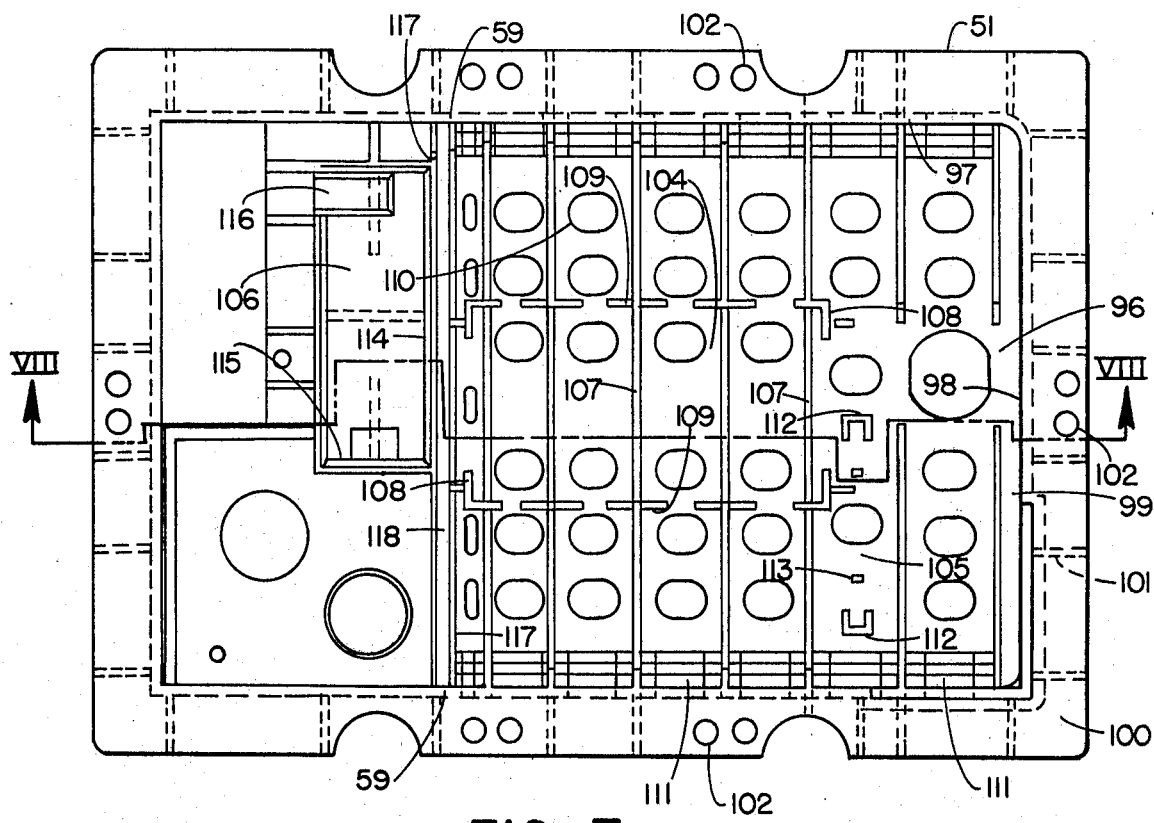
FIG. 7 is an elevational view of a base portion of the housing, showing an interior surface thereof.

The housing cover 51 (FIGS. 7 and 8) includes a base panel 96 having side and end walls 97 and 98, respectively, extending outwardly of an inside surface 99 thereof to form a cavity having a sufficient depth to encase the electrical components 3 of the power converter. The outer end edge 99a of the side and end walls 97 and 98 includes a flange 100 extending outwardly of the marginal edge thereof, and having a substantially rectangular shape which mates with the panel flange 57. The flange 100 includes the plurality of spaced apart ribs 101 disposed on an exterior surface thereof for reinforcing the housing structure, and a plurality of apertures 102 which are aligned with and adapted to receive therein the studs 94 which project from the housing cover to interconnect the panel and cover portions of the housing. The interior surface 99 of the cover panel 96 includes a transformer socket 104, a rectifier socket 105, and a circuit breaker socket 106, which are aligned with the corresponding panel sockets 74, 75, 76, respectively. Ribs 107 project outwardly of the cover panel interior surface 99 and extend thereacross to form a surface which is adapted to abuttingly engage the rearward end of the transformer adapter 42. The ribs 107 extend from the cover panel 96 upwardly along the sidewalls 97 of the housing cover in a mutually parallel fashion and project from both the interior surface and the exterior surface to form a rigid and sturdy construction. The forward and rearward transformer sockets 74 and 104 are substantially identical in construction, and include L-shaped corner braces 108 and aligned retainers 109 which extend upwardly of the outside surface of the ribs 107, thereby forming a well or recess, designated as socket 104. The sidewalls 97 and base panel 96 of the housing base are preferably provided with a plurality of apertures 110 through which air can flow to cool the electrical components 3. The illustrated sidewalls 97 have inwardly stepped portions 111 adjacent to the base panel 96 which impart a taper to the sidewalls for tooling purposes.

In like manner, the rectifier socket 105 includes U-shaped channels 112 and posts 113 disposed therebetween for telescopically receiving the rearward end edge of the rectifier board 46 therein, and spacing the same a predetermined distance from the base panel 96. The circuit breaker socket 106 is formed by side and end walls 114 and 115, respectively, projecting outwardly of a base 115a, which is upstanding from the base panel 96. The side and end walls 114 and 115 are slightly tapered, and have a substantially rectangular shape to receive the rearward end of the circuit breaker 33 therein. The illustrated socket 106 (FIG. 7) includes one pair of adjacent side and end walls 114 and 115 which are oriented outwardly to form a slot 116 to receive the input terminal 39 of the circuit breaker therein.

Figure 8:
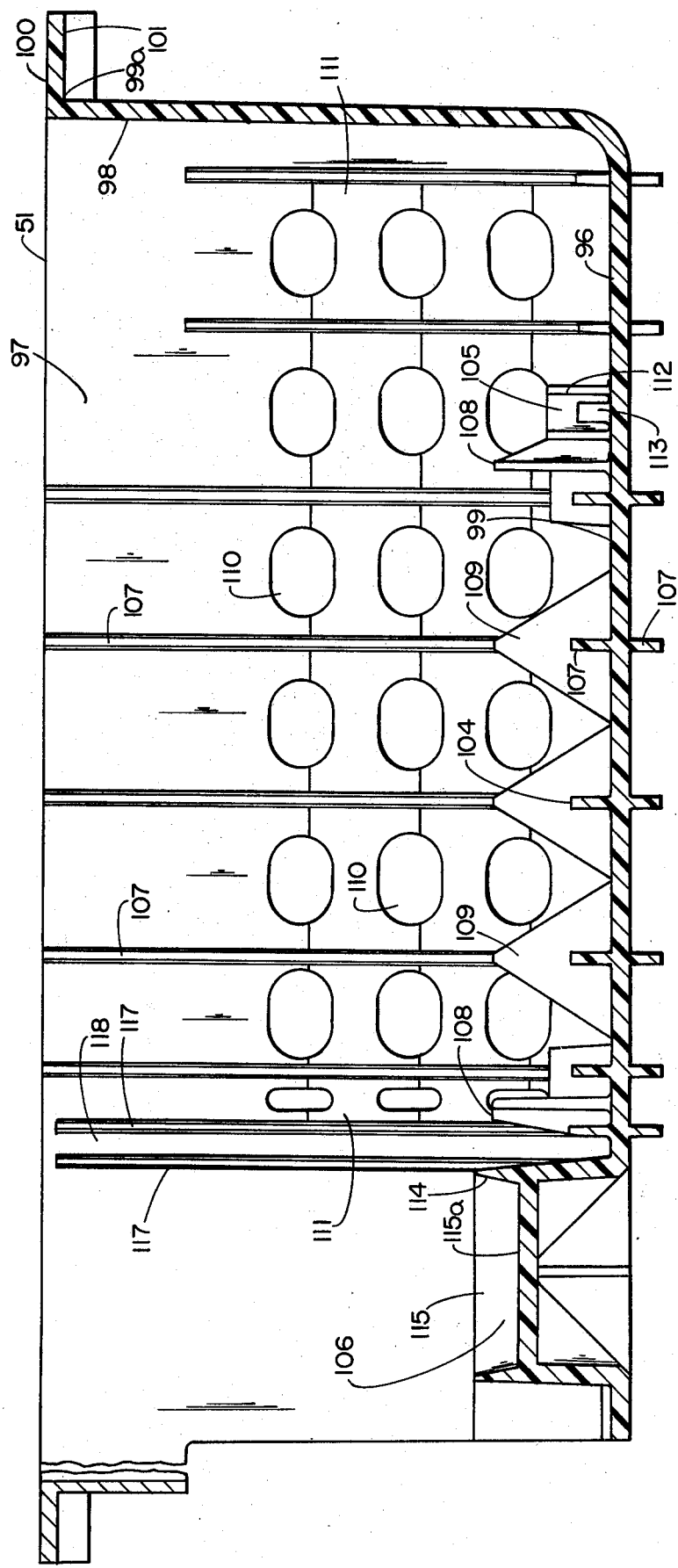
FIG. 8 is a cross-sectional view of the housing base, taken along the line VIII—VIII of FIG. 7.

A pair of parallel ribs 117 corresponding to ribs 87 project outwardly of the cover interior surface 99 and extend thereacross to form a U-shaped channel 118 which is adapted to telescopically receive the rearward end edge of the partition 89 therein. As best illustrated in FIG. 8, the ribs 117 and U-shaped channel 118 therebetween, extend from the cover panel 96 upwardly along both of the sidewalls 97 of the housing cover to a point adjacent to the upper edge thereof, thereby forming a track or seal substantially completely around the marginal edge of the partition 90.

Figure 9:
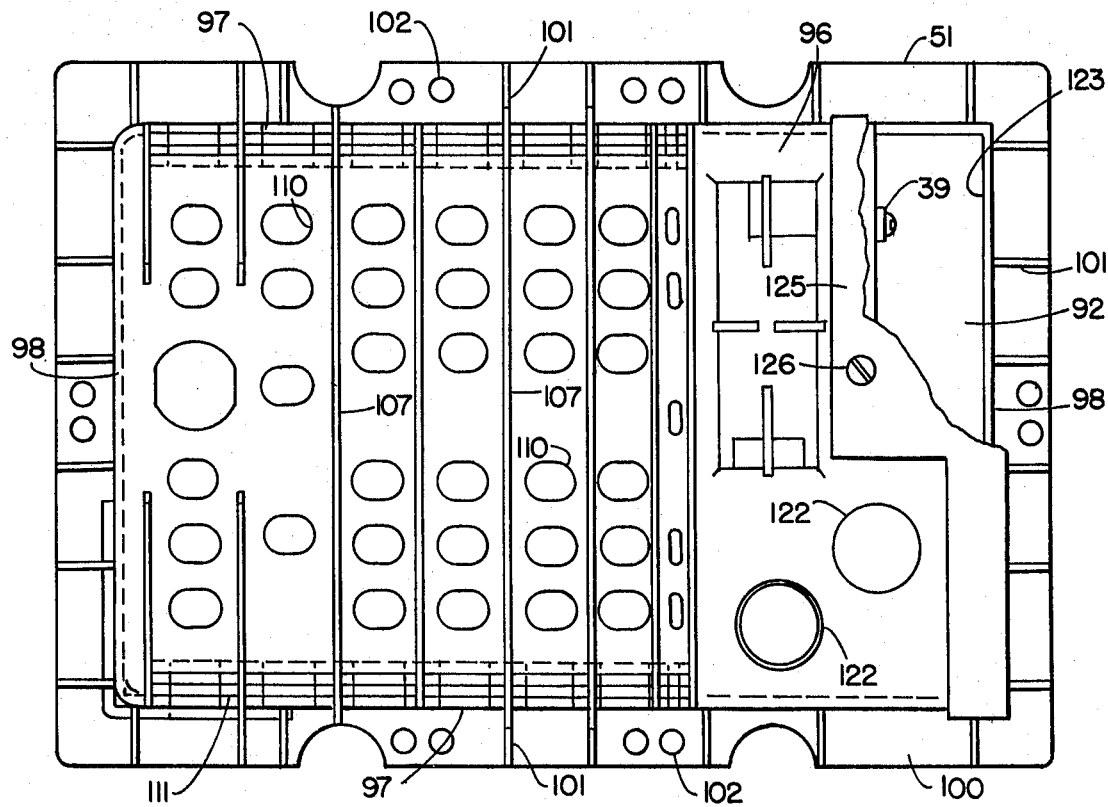
FIG. 9 is an elevational view of the housing base, showing an exterior surface thereof.
Figure 11:
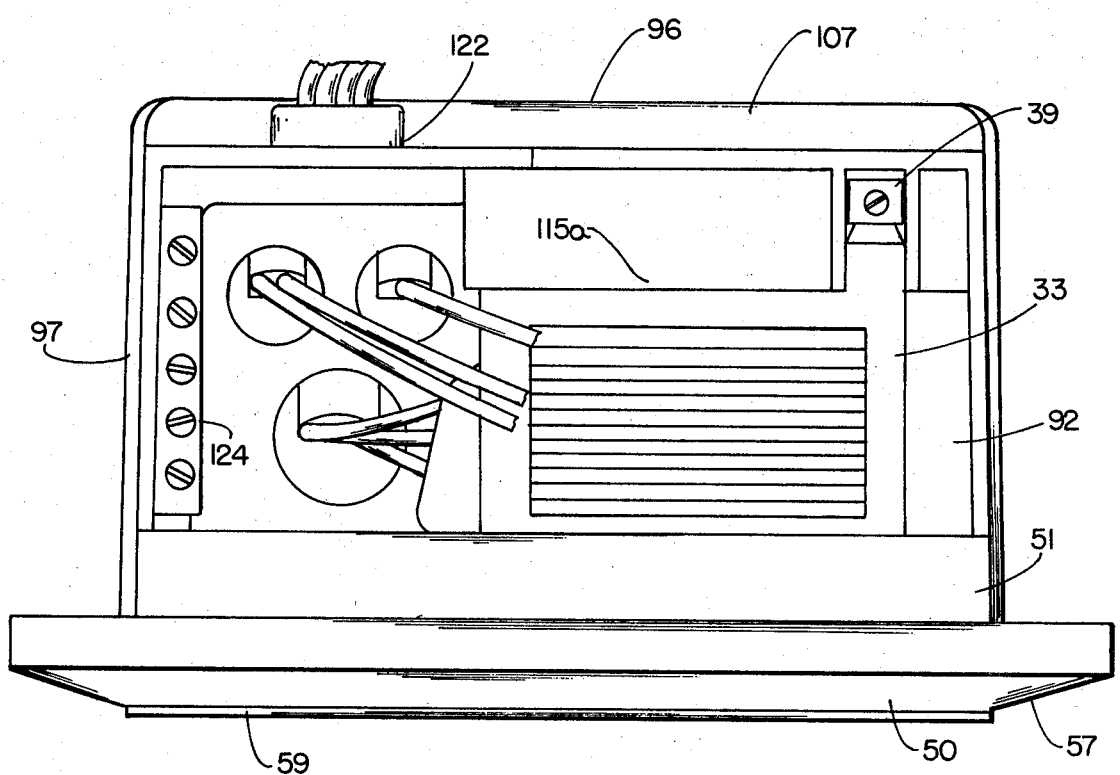
FIG. 11 is a rear elevational view of the power converter with an access cover portion thereof removed to reveal the electrical components and interconnection.

As best illustrated in FIG. 9, the housing cover 51 also includes a pair of apertures 122 therethrough in the circuit breaker compartment 92 of the housing to receive the electrical power source conductor 20 therethrough and connect the same with the converter. The front panel 96 also includes an access aperture 123 disposed through the upper left-hand corner thereof (as viewed facing the panel 50) and provides a terminal block 124 (FIG. 11) to which the vehicle wiring system 10 is connected. The size of the access aperture 123 is sufficient to connect the vehicle's wiring, but prevents tampering with the electrical components 3 and/or their interconnection or mounting. A cover 125 is provided for the access aperture 123, and is detachably connected with the housing cover by a fastener 126.

Both the housing panel 50 and cover 51 are preferably constructed of a non-metallic material, so as to reduce the hazard of shock. The illustrated housing members 50 and 51 are constructed of a synthetic resin material, and are molded with the ribs, flanges, and other projections formed integrally therewith.

In use, the power converter 1 is assembled at the manufacturing location by initially selecting a mating housing panel 50 and cover 51. The electrical components of the power converter, such as the transformer 31, rectifier 32, and circuit breaker 33 are electrically interconnected, and, mounted between the housing members, by initially inserting the adapters 42 over each end of the transformer 31 so as to present a regularly shaped frame which is adapted to be telescopically inserted into the corresponding transformer sockets 74 and 104. Preferably, the housing panel 50 is placed upside down on a work surface, and the forward end of each of the electrical components is initially inserted into the respective socket. The partition 90 is similarly inserted between the ribs 88 into the U-shaped channel 89. The housing cover 51 is then positioned over the partially assembled housing panel 50, and the socket pairs 74 and 104, 75 and 105, and 76 and 106 are aligned. The opposed partition channels 89 and 118 are also aligned, and the housing portions are converged along an axis which is parallel with the axes of the sockets and the plane of the partition. With the opposing ends of the electrical components positioned between and aligned with the associated socket pairs, the housing portions are converged until the rearward end of each of the electrical components is securely located within its associated socket, the end edge of the partition is positioned within the rearward U-shaped channel, the cover and base flanges 57 and 100 abut, and the studs 94 project through the base apertures 102. In this position, each of the electrical components and the partition is captured between the housing portions, panel 50 and cover 51, thereby securely mounting the electrical components in the housing without requiring separate or special fasteners to attach the components to either the front panel 50 or the back cover 51. In this manner, the panel 50 is not defaced, and there are no fasteners projecting through the housing to present an electrical shock hazard. The forwardly projecting portion 36 (FIG. 10) of the circuit breaker 33 extends through the corresponding aperture 61 in the housing panel to center the same therein, and the upper edges of the socket end walls 86 abut the circuit breaker shoulder 37 to transversely position the circuit breaker between the housing panel and cover. The free ends of the studs 94 are then deformed by means such as heat, vibration, or the like, to form permanent fasteners which interconnect the cover and base portions of the housing. The permanent fasteners form a tamperproof, unitized housing construction which securely mounts the electrical components therein.

The power converter 1 is installed in the recreational vehicle 2 by providing an aperture in a sidewall thereof, which is shaped in accordance with the outer perimeter of the housing cover 51. The power conductor 20 is then threaded through the base aperture 122, the vehicle appliance wires are similarly introduced into the interior of the base compartment 90, and the same are connected with an appropriate terminal of the terminal block 124 through the access aperture 123. The cover 125 is then fastened to the housing cover 51 thereby closing the access aperture 123 and sealing the unit. The power converter assembly is then mounted on the interior sidewall 16 of the vehicle by means such as the threaded fasteners 60.

From the foregoing description, it will be readily appreciated by those skilled in the art that many modifications may be made to the invention without departing from the concepts disclosed herein. Such modifications are to be considered as included in the following claims, unless these claims by their language expressly state otherwise.

The embodiments of the invention in which an exclusive property or privilege is claimed are defined as follows:

1. A power converter for recreational vehicles, comprising:
    (a) at least two electrical components being electrically interconnected for altering the characteristics of a source of electrical power;
    (b) a housing adapted for mounting in said recreational vehicle, and including first and second portions; each of said housing portions having an interior surface with sockets positioned thereon for said electrical components; each of said sockets being shaped to telescopically receive therein one end of an associated electrical component and surround said component end on each side thereof to retain the same in place; said sockets being arranged in pairs with one member of each pair disposed in said first and second housing portions, respectively, and the members of each socket pair being aligned for receiving the associated electrical component therebetween; each of said sockets having a central axis which is disposed in a mutually parallel relationship; and
    (c) said first and second housing portions being interconnected with alignment of said socket pairs, and convergence of the same along an axis parallel with the axes of said sockets, with opposing ends of said electrical components positioned between and aligned with the associated socket pair, whereby each of said electrical components is captured therebetween to securely mount said electrical components in said housing without separate fasteners.

2. A power converter as set forth in claim 1, wherein:
    (a) said electrical components include a conventional, household circuit breaker; and
    (b) said circuit breaker is captured between an associated one of said socket pairs for mounting the same in said housing without special fasteners.

3. A power converter as set forth in claim 1, wherein:
    (a) said electrical components include a transformer, a rectifier, and a circuit breaker, each being captured between an associated pair of said sockets.

4. A power converter as set forth in claim 3, including:
    (a) a partition disposed within said housing along a plane substantially parallel with said socket axes, and dividing said housing into two separate compartments; and wherein
    (b) said transformer and said rectifier are mounted within one of said compartments and said circuit breaker is mounted within the other of said compartments to isolate the same.

5. A power converter as set forth in claim 4, wherein:
    (a) said partition includes forward and rearward end edges which are telescopically received in an associated pair of said sockets disposed in an aligned relationship on the interior surface of said first and second housing portions, respectively, whereby said partition is captured therebetween to mount the same in said housing without separate fasteners.

6. A power converter as set forth in claim 1, wherein:
  (a) said first and second housing portions are interconnected with permanent fasteners to form a tamperproof, utilized housing construction which securely mounts said electrical components therein.

7. A power converter as set forth in claim 6, wherein:
  (a) said housing includes an access aperture and removable cover therefor disposed adjacent to a terminal component of said converter for electrically interconnecting said converter with a recreational vehicle without disturbing the mounting of said electrical components within said housing.

8. A power converter as set forth in claim 1, wherein:
  (a) said housing is constructed of a non-metallic material for alleviating the hazard of electrical shock.

9. A power converter as set forth in claim 1, wherein:
  (a) said electrical components include a conventionally shaped transformer having first and second opposing ends; and including
  (b) first and second adapters having a marginal interior surface which is substantially identical in shape with said first and second transformer ends, respectively, and telescopically receives said ends therein, and a marginal exterior surface which is substantially identical in shape with the associated socket pair and telescopically receives the same therein, whereby the conventionally shaped transformer is securely mounted within said housing without special fasteners.

10. A power converter as set forth in claim 8, wherein:
  (a) said electrical components include a conventional, household circuit breaker; and
  (b) said circuit breaker is captured between an associated one of said socket pairs for mounting the same in said housing without special fasteners.

11. A power converter as set forth in claim 10, including:
  (a) a partition disposed within said housing along a plane substantially parallel with said socket axes, and dividing said housing into two separate compartments; and wherein
  (b) said transformer is mounted within one of said compartments, and said circuit breaker is mounted within the other of said compartments to isolate the same; and
  (c) said partition includes forward and rearward end edges which are telescopically received in an associated pair of said sockets disposed in an aligned relationship on the interior surface of said first and second housing portions, respectively, whereby said partition is captured therebetween to mount the same in said housing without separate fasteners.

12. A recreational vehicle power converter housing for electrical components, comprising:
  (a) first and second housing portions; each of said housing portions having an interior surface with sockets positioned thereon for said electrical components; each of said sockets being shaped to telescopically receive therein one end of an associated electrical component and surround said component end on each side thereof to retain the same in place; said sockets being arranged in pairs with one member of each pair disposed in said first and second housing portions, respectively, and the members of each socket pair being aligned for receiving the associated electrical component therebetween; each of said sockets having a central axis which is disposed in a mutually parallel relationship; and
  (b) said first and second housing portions being interconnected with alignment of said socket pairs, and convergence of the same along an axis parallel with the axes of said sockets, with opposing ends of said electrical components positioned between and aligned with the associated socket pair, whereby each of said electrical components is captured therebetween for securely mounting said electrical components in said housing without separate fasteners.

13. A recreational vehicle power converter housing for electrical components, comprising:
  (a) first and second housing portions; each of said housing portions having an interior surface with socket means positioned thereon for each of said electrical components; each of said socket means being shaped to receive therein one end of an associated electrical component and surround said component end on each side thereof to retain the same in place; said socket means being arranged in pairs with one member of each pair disposed in said first and second housing portions, respectively, and the members of each socket means pair being aligned for receiving the associated electrical component therebetween; each of said socket means having a central axis which is disposed in a mutually parallel relationship; and
  (b) said first and second housing portions being interconnected with alignment of said socket means pairs, and convergence of the same along an axis parallel with the axes of said socket means, with opposing ends of said electrical components positioned between and aligned with the associated socket means pair, whereby each of said electrical components is captured therebetween for securely mounting said electrical components in said housing without separate fasteners.

14. A recreational vehicle power converter housing for electrical components, comprising:
  (a) first and second housing portions; at least one of said housing portions having an interior surface with socket means positioned thereon for each of said electrical components; said other housing portion having retaining means for holding said electrical components in said socket means; said socket means being shaped to receive therein one end of an associated electrical component and surround said component end on each side thereof to retain the same in place; said socket means and retaining means being arranged in pairs with one member of each pair disposed in said first and second housing portions, respectively, and the members of each said pair being aligned for receiving the associated electrical component therebetween;
  (b) said first and second housing portions being interconnected by alignment of said socket means and retaining means pairs, and convergence of the same, with opposing ends of said electrical components positioned between and aligned with an associated socket means and retaining means pair, whereby each of said electrical components is captured therebetween for securely mounting said electrical components in said housing without separate fasteners.

15. A power converter housing as set forth in claims 12, 13, or 14 wherein:
    (a) said electrical components include a conventional, household circuit breaker; and
    (b) said circuit breaker is captured between an associated one of said pairs for mounting the same in said housing without special fasteners.

16. A power converter housing as set forth in claims 12, 13, or 14 wherein:
    (a) said electrical components include a transformer, a rectifier, and a circuit breaker.

17. A power converter housing as set forth in claim 16, including:
    (a) a partition disposed within said housing along a plane substantially parallel with said socket, and dividing said housing into two separate compartments; and wherein
    (b) said transformer and said rectifier are mounted within one of said compartments and said circuit breaker is mounted within the other of said compartments to isolate the same.

18. A power converter housing as set forth in claim 17, wherein:
    (a) said partition includes forward and rearward end edges which are telescopically received in an associated pair of said sockets disposed in an aligned relationship on the interior surface of said first and second housing portions, respectively, whereby said partition is captured therebetween to mount the same in said housing without separate fasteners.

19. A power converter housing as set forth in claims 12, 13, or 14, wherein:
    (a) said first and second housing portions are interconnected with permanent fasteners to form a tamperproof, unitized housing construction which securely mounts said electrical components therein.

20. A power converter housing as set forth in claim 19, wherein:
    (a) said housing includes an access aperture and removable cover therefore disposed adjacent to a terminal component of said converter for electrically interconnecting said converter with a recreational vehicle without disturbing the mounting of said electrical components within said housing.

21. A power converter housing as set forth in claims 12, 13, or 14, wherein:
    (a) said housing is constructed of a non-metallic material for alleviating the hazard of electrical shock.

22. A power converter housing as set forth in claims 12, 13, or 14, wherein:
    (a) said electrical components include a conventionally shaped transformer having first and second opposing ends; and including
    (b) first and second adapters having a marginal interior surface which is substantially identical in shape with said first and second transformer ends, respectively, and telescopically receives said ends therein, and a marginal exterior surface which is substantially identical in shape with the associated socket pair and telescopically receives the same therein, whereby the conventionally shaped transformer is securely mounted within said housing without special fasteners.

23. A power converter housing as set forth in claim 21, wherein:
    (a) said electrical components include a conventional, household circuit breaker; and
    (b) said circuit breaker is captured between an associated one of said pairs for mounting the same in said housing without special fasteners.

24. A power converter housing as set forth in claim 23, including:
    (a) a partition disposed within said housing along a plane substantially parallel with said socket axes, and dividing said housing into two separate compartments; and wherein
    (b) said transformer is mounted within one of said compartments, and said circuit breaker is mounted within the other of said compartments to isolate the same; and
    (c) said partition includes forward and rearward end edges which are telescopically received in an associated pair of socket disposed in an aligned relationship on the interior surface of said first and second housing portions, respectively, whereby said partition is captured therebetween to mount the same in said housing without separate fasteners.

* * * * *